United States Patent [19]

Guisinger

[11] 4,405,954
[45] Sep. 20, 1983

[54] RADIO FREQUENCY EQUALIZER

[75] Inventor: Barrett E. Guisinger, Saratoga, Calif.

[73] Assignee: Sony Corporation, Tokyo, Japan

[21] Appl. No.: 324,773

[22] Filed: Nov. 25, 1981

[51] Int. Cl.³ .......................... G11B 5/45; G11B 5/02
[52] U.S. Cl. ........................................ 360/65; 360/67
[58] Field of Search .................... 360/67, 65; 333/16, 333/28 R, 28 T

[56] References Cited
U.S. PATENT DOCUMENTS 3,757,254 9/1973 Takahashi ............................. 360/65
4,271,439 6/1981 Wray ................................... 360/65

Primary Examiner—Vincent P. Canney

Attorney, Agent, or Firm—Philip M. Shaw, Jr.

[57] ABSTRACT

A control circuit for selectively combining two or more input signals is comprised of two amplifier circuits, each having two input stages and a dual output stage with one output stage of each amplifier circuit being gain controllable in response to a control signal. The gain controllable output stages are connected to a single combined output terminal and the other output stages are connected to a circuit ground. One input signal is supplied to one input stage of each amplifier circuit whereas the other input signal is supplied in non-inverted form to the other input stage of one of the amplifier circuits and is supplied in inverted form to the other input stage of the other amplifier circuit.

12 Claims, 4 Drawing Figures

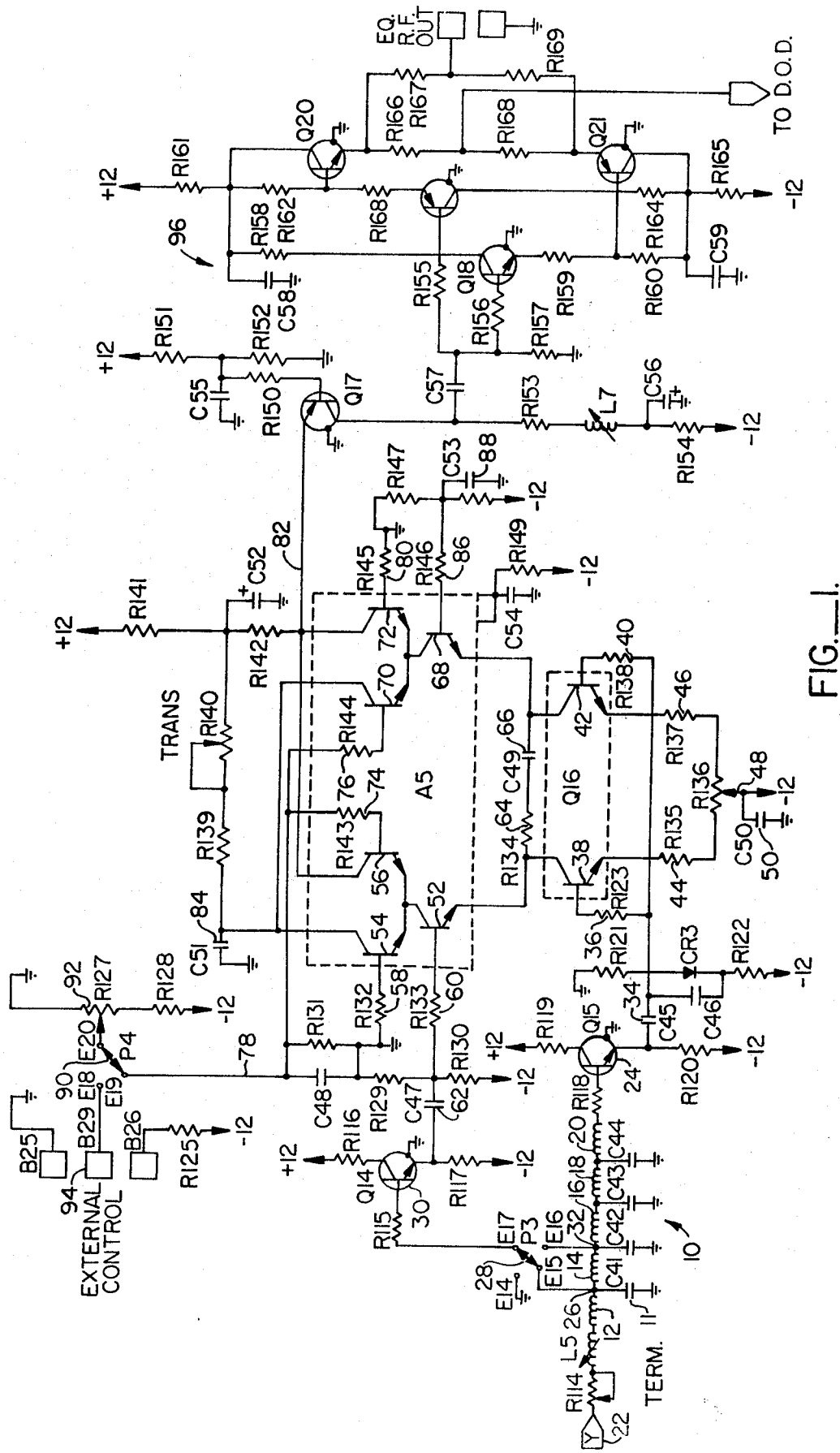
FIG.—1.

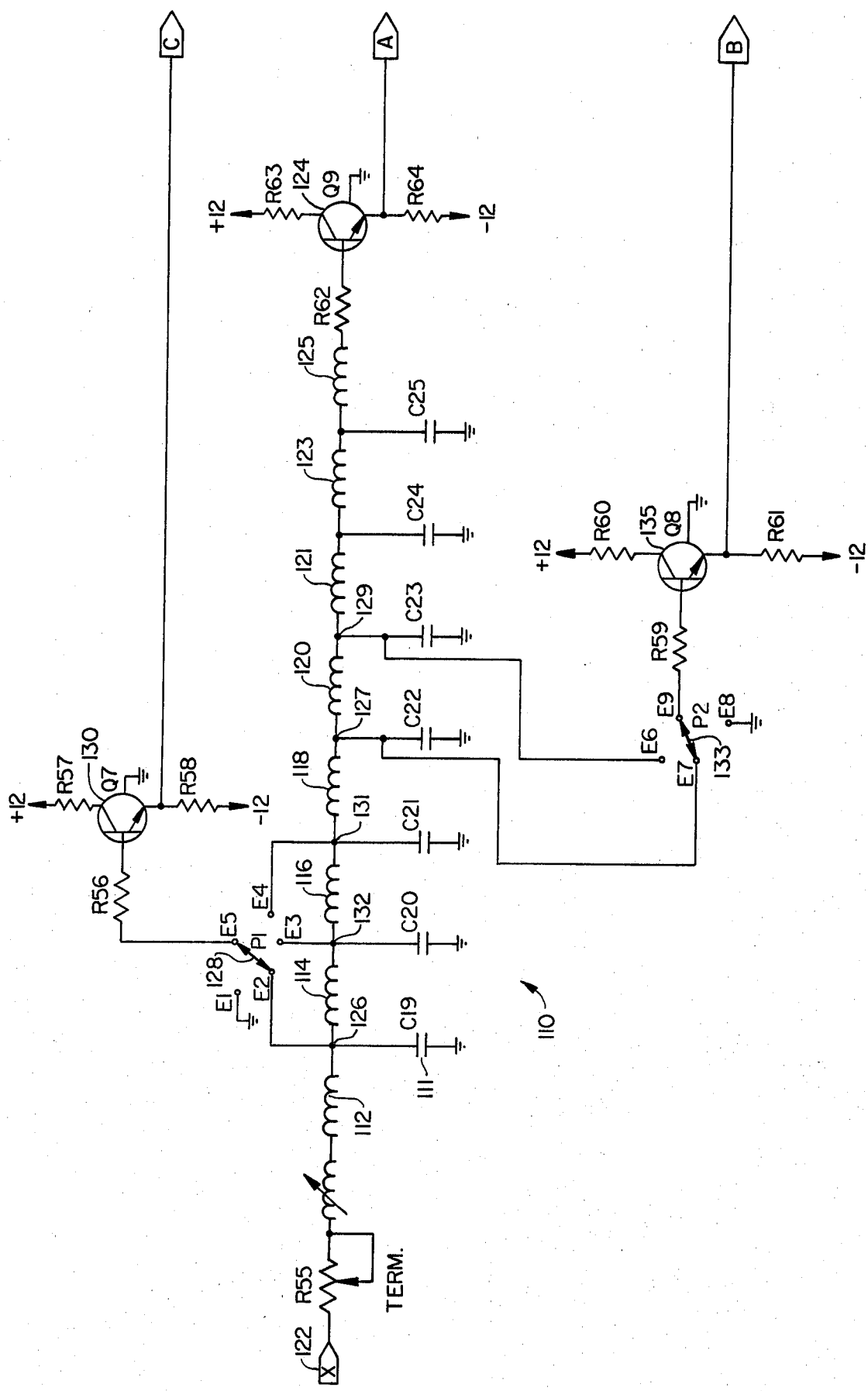
FIG._2A.

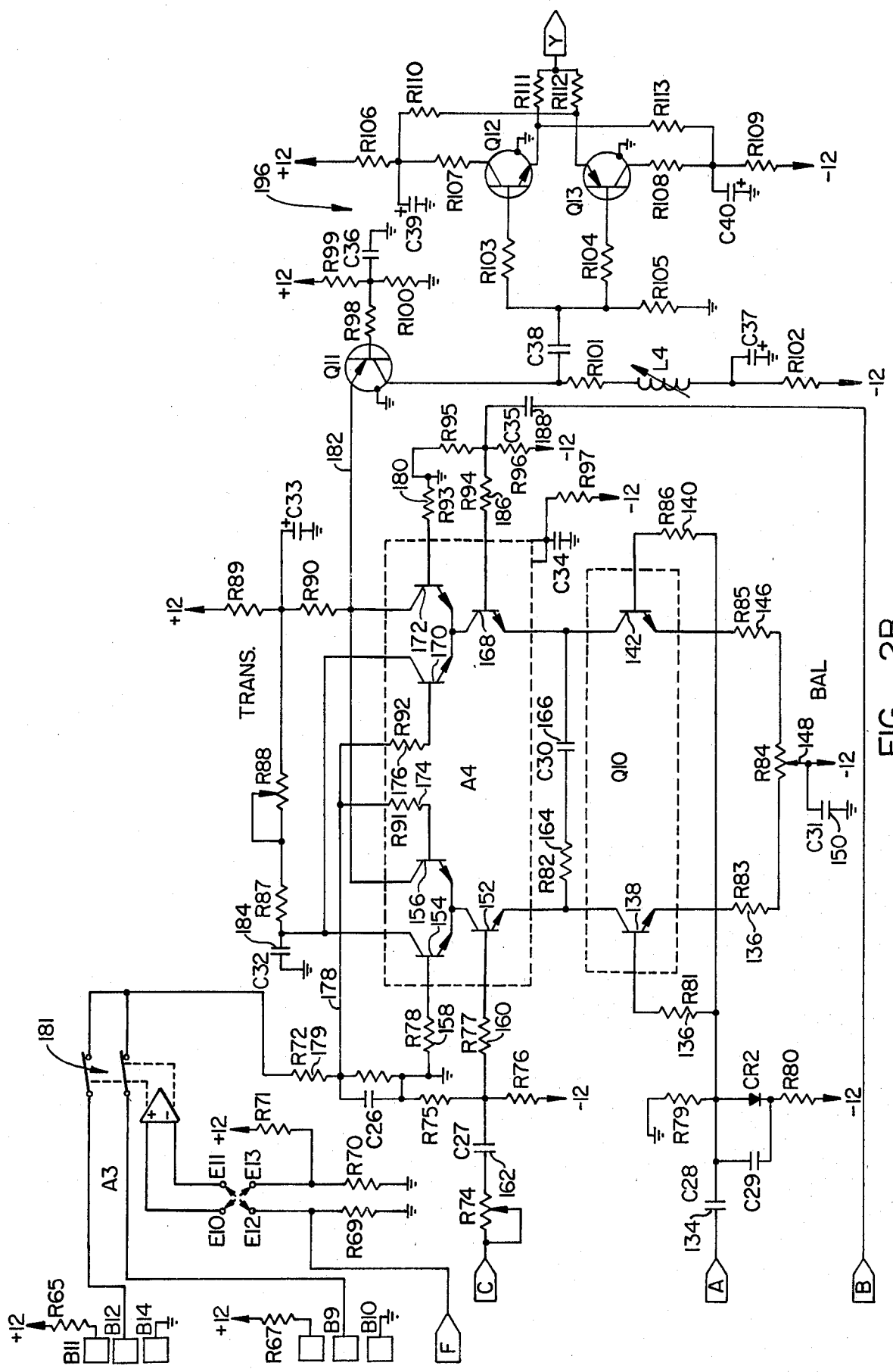
FIG._2B.

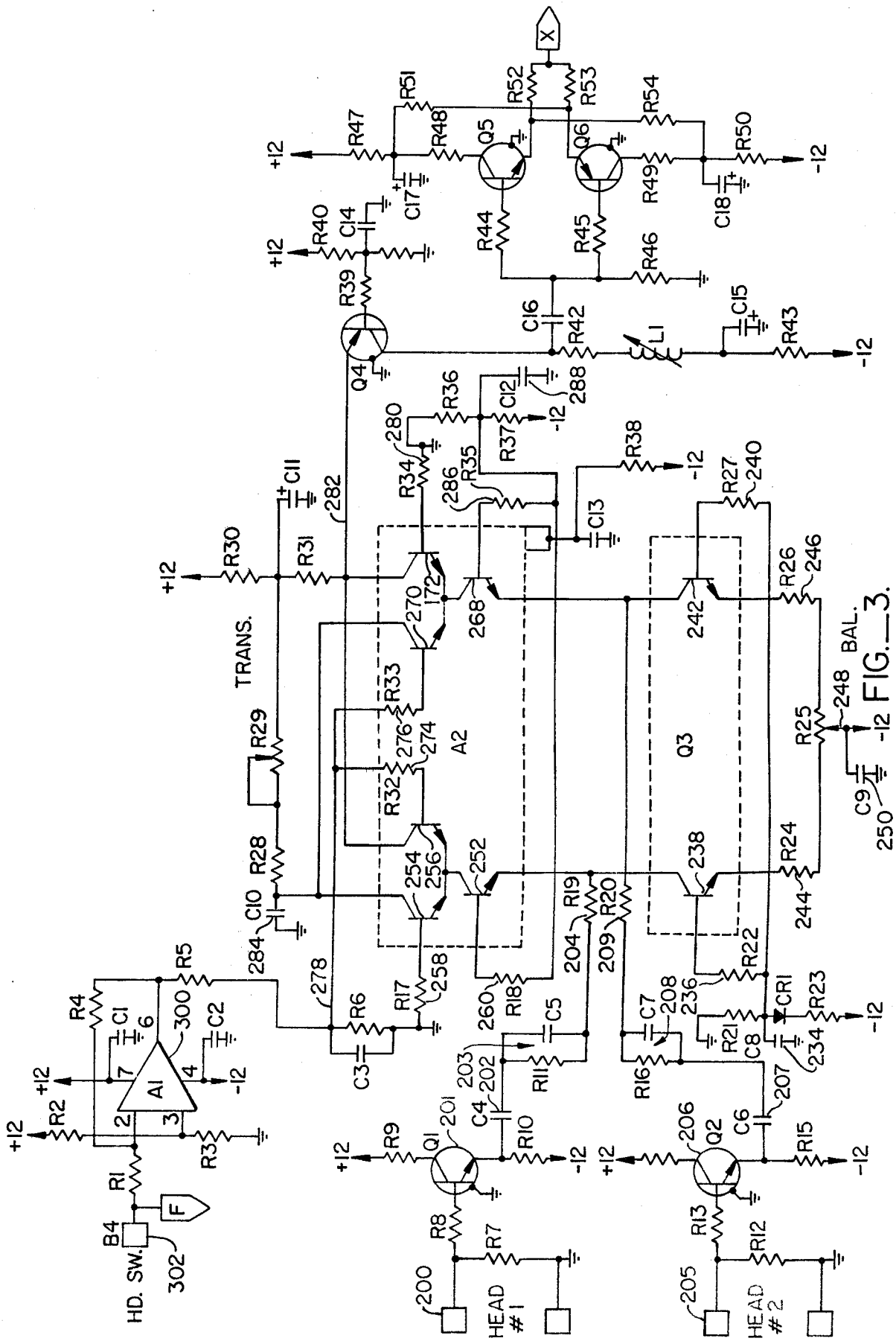
FIG._3.

4,405,954

RADIO FREQUENCY EQUALIZER

BACKGROUND OF THE INVENTION

This invention relates to a control circuit for mixing two or more signals and more particularly to such a control circuit when embodied in an RF equalizer.

It is desirable in the reproduction of recorded signals, in particular signals recorded on magnetic media, to compensate for frequency response roll-off. In video tape recording or reproducing this must be corrected before the signal enters the frequency demodulator. Even in an audio system it is desirable and sometimes necessary to correct for the amplitude roll-off with frequency.

In the past this has been corrected by an equalizer circuit which utilizes a time delay having a plurality of time delay elements connected in series. The end output of the time delay is combined together with taps along the series connected time delay elements in a known manner such that phase shifts produced by the time delays produce a combined signal having a relatively flat frequency response over a defined frequency range.

In situations where the reproduction of the recorded signals involve the use of a plurality of magnetic recording heads, such as the rotating magnetic heads in a video tape recording and reproducing apparatus, the roll-off compensation is different for each magnetic head. Also, it is sometimes desirable to shift the range over which the frequency response is to be compensated to produce a flat response.

While there exist prior art methods which would be suitable for controlling an RF equalizer circuit, these prior art methods cause the control signal to be introduced in the signal being reproduced from the magnetic media. This is obviously undesirable. What is required is a controllable RF equalizer which does not superimpose the equalization control signal upon the output signal.

SUMMARY OF THE INVENTION

The present invention solves the problem of controlling the mixture of two or more signals without introducing a control signal component by providing essentially two parallel signal control branches, each branch having a dual output stage. One output of the stage is shunted to the circuit ground and the other output is connected to a combined output terminal. One of the signals to be mixed is applied to both branches. A second and/or a third signal to be mixed together with the first signal are applied to separate control elements in opposite ones of the branches.

The branch output stages are controllable via a control line such that when a control signal of a predetermined magnitude and polarity is applied to the control line, one of the output stages of one branch will shunt its output signal to the circuit ground while the output stage of the other branch provides an output signal to the combined output terminal. If a control signal of a different polarity or magnitude is applied to the output stages, the reverse process will take place.

The two branches are interconnected at a mid-point such that the second signal to be mixed will appear at one of the output stages in non-inverted form and at the opposite output stage in inverted form. Similarly the third signal will appear in inverted form at the one output stage and in a non-inverted form at the opposite output stage.

Thus by suitable choice of the magnitude and polarity of the control signal to be applied to the control signal line the second and third signals can be combined with the first signal in various proportions in their inverted and non-inverted forms to allow any combination of the signals which is desired. At the same time, since the portion of the signal which is not chosen to appear at the combined output terminal is shunted to the circuit ground, the amplitude of the output signal is not affected by the control signal and thus the control signal does not appear as a part of the signal at the combined output terminal.

In the preferred embodiment the combining circuit comprises first, second, third, fourth, fifth, sixth, seventh and eighth transistors, each having its own base, collector and emitter terminal. Also provided in the circuit are first, second, and third input terminals, and a control signal input terminal. Means are provided for connecting the collectors of the first and fifth transistors to the combined output terminal, for connecting the collector terminals of the second and sixth transistors to the circuit ground, and for connecting the base terminals of the second and fifth transistors to the circuit ground. Means are also provided for connecting the base terminals of the first and sixth transistors to the control signal input terminal, for connecting the emitters of the first and second transistors to the collector of the third transistor, and for connecting the emitters of the sixth and fifth transistors to the collector of the seventh transistor.

The emitter of the third transistor is connected to the collector of the fourth transistor, and the emitter of the seventh transistor is connected to the collector of the eighth transistor. The emitters of the fourth and eighth transistors are connected to the circuit ground and a load resistance is connected between the collectors of the fourth and eighth transistors. The bases of the fourth and eighth transistors are connected to the first signal input terminal. The base of the third transistor is connected to the second signal input terminal, and the base of the seventh transistor is connected to the third signal input terminal. Biasing means supplies biasing voltages to the emitter, base and collector electrodes of the first, second, third, fourth, fifth, sixth, seventh and eighth transistors.

The signal derived at the combined output terminal is representative of a signal supplied to the first input terminal plus or minus (depending upon the magnitude and polarity of the signal applied to the control signal input terminal), the difference between the signals supplied to the second input terminal and the third signal input terminal.

The preferred use of the control circuit is in conjunction with a time delay line having an input terminal, an output terminal, and at least a first and a second time delay element connected in series between the input terminal and the output terminal. Means are provided for connecting the second signal input terminal of the control circuit to a point in the time delay line between its input terminal and the first time delay element and for connecting the output terminal of the time delay line to the first signal input terminal of the control circuit. The third signal input terminal of the control circuit is connected to a point in the time delay line which is intermediate the first and the second time delay elements.

When used as an RF equalizer for a video tape recorder/player of the type having a plurality of rotatable recording heads, means are provided for sensing the rotation of the recording heads and for producing an output control signal representative of the angular position of the rotatable recording heads. Means responsive to said recording head position control signal supply a control signal to the control input of the equalization circuit which is representative of the angular position of the recording heads.

It is therefore an object of the present invention to provide a control circuit for mixing a plurality of signals without introducing the control signal as part of the output signal.

It is still another object of the invention to provide an improved RF equalizer circuit.

It is still another object of the invention to provide an improved RF equalizer circuit for use with magnetic media recorders/players.

It is yet a further object of the invention to provide an improved RF equalizer circuit for use with a video tape recorder/player.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 1 is a schematic diagram of an RF equalizer circuit according to a first embodiment of the invention;

FIG. 2A is a schematic diagram of a time delay line for use in a second embodiment of the invention;

FIG. 2B is a schematic diagram of the control circuit according to a second embodiment of the diagram for use with the time delay depicted in FIG. 2A; and FIG. 3 is a head switch control circuit according to a third embodiment of the invention.

DETAILED DESCRIPTION OF CERTAIN PREFERRED EMBODIMENTS

Referring now more particularly to FIG. 1, a time delay line 10, comprises of plurality of series connected time delay elements 12, 14, 16, 18 and 20 is connected between an input terminal 22 and the base terminal of a common-emitter connected NPN transistor buffer stage 24.

A point 26, located in the delay line between the input terminal 22 and the time delay element 14, is connected through a single pole, triple throw switch 28 to the base terminal of an NPN transistor 30 connected in a common-emitter configuration. The other terminals of the switch 28 are connected, respectively, to the circuit ground and to a point 32 in the delay line located between the time delay elements 14 and 16. The amount of time delay signal reaching the transistor 30 is thus selectable by the position of the switch 28.

The output from the time delay line buffer stage is taken at the emitter of transistor 24 and is supplied to one side of a capacitor 34. The other side of the capacitor 34 is connected through a resistor 36 to the base terminal of an NPN transistor 38 and through a resistor 40 to the base terminal of an NPN transistor 42. The emitter terminals of the transistors 38 and 42 are connected, respectively, through resistors 44 and 46 to opposite ends of a balance potentiometer 48. The contact arm of the potentiometer is connected through a capacitor 50 to the circuit ground and is connected directly to a minus 12 volt power supply.

The transistors 38 and 42 constitute the bottom halves of two parallel branches of the signal controlling circuit. The collector of the transistor 38 is connected to the emitter of an NPN transistor 52. The collector of transistor 52 is connected to the emitters of separate NPN transistors 54 and 56. The base terminal of transistor 54 is connected through a resistor 58 to the circuit ground. The base terminal of transistor 52 is connected through a resistor 60 in series with a capacitor 62 to the emitter terminal of transistor 30.

A resistor 64 is connected in series with a capacitor 66 between the collectors of transistors 38 and 42. The collector of transistor 42 is also connected to the emitter of an NPN transistor 68 whose collector is connected to the emitters of two NPN transistors 70 and 72.

The base terminals of the transistors 56 and 70 are connected through separate resistors 74 and 76, respectively, to a control signal input line 78. The base of the transistor 72 is connected through a resistor 80 to the circuit ground. The collectors of the transistors 56 and 72 are connected together to a combined signal output line 82 and the collectors of the transistors 54 and 70 are connected together to one side of a capacitor 84 whose other side is connected to the circuit ground.

The base terminal of transistor 68 is connected through a series connection of the resistor 86 and a capacitor 88 to the circuit ground. The control signal input line 78 is selectively connected through a switch 90 either to an adjustable bias source 92 or to an external control signal input terminal 94.

In operation, a "first" signal, derived from the buffer 24, is supplied to the bases of the dual transistors 38 and 42. When all of the transistors 54, 56, 70 and 72 are conductive, this first signal appears at their collectors. Since the collectors of the transistors 54 and 70 are connected to the circuit ground through the capacitor 84, the signal at these collectors is effectively not used and only the signal at the collectors of transistors 56 and 72 reaches the combined signal output line 82.

The emitter resistors 44 and 46 of the transistors 38 and 42 are the same value so that the same magnitude of signal current appears out of their collectors, and in phase. If a control voltage is applied to the control signal line 78 which is very positive, then all signal current from the transistor 38, appearing at its collector, will appear at the collector of transistor 56. Thus the signal travels up through the transistor 52 and through the transistor 56 to the output signal line 82. The corresponding signal current traveling up through the transistor 68 from the collector of transistor 42 will go out through the transistor 70 to the circuit ground, since the transistor 70 is much more coductive than the transistor 72.

If a control signal having a negative polarity is applied to the control signal line 78, then the opposite result will occur. The transistor 56 will become far less conductive than the transistor 54, thus all of the signal traveling through the transistor 52 will be shunted to the circuit ground whereas the signal traveling through the transistor 68 will appear at the collector of transistor 72 connected to the combined output line 82. No matter what is done with the control voltage applied to line 78, it will have no effect on the level of the signal out on line 82. The direct current operating point of the signal on line 82 will not be changed, regardless of variations in the control signal input to line 78.

The reflected signal derived from points 26 or 32 and appearing at the emitter of the transistor 30 constitutes a "second" input signal and is supplied to the lefthand branch of the control circuit comprised of the transistor 52 and the transistors 54 and 56, and through the resistor 64 and capacitor 66 to the right hand branch of the control circuit which includes the transistors 68, 70 and 72. This signal will appear in inverted form at the collectors of the transistors 54 and 56 and in non-inverted form at the collectors of the transistors 70 and 72. Thus if the control signal applied to the signal line 78 is chosen so that the transistors 54, 56, 70 and 72 are all equally conductive, then there will be no net output on the line 82 due to the signal derived at the output of transistor 30, since the inverted and noninverted signals will cancel each other out.

If, however, the control signal applied to the line 78 is chosen such that the transistors 56 and 70 are far more conductive than the transistors 54 and 72, then the inverted form of the output signal from the transistor 30 will appear on the output line 82 and the noninverted form of the signal will be shunted to ground. The net result is that the signal derived at the points 26 or 32 is being subtracted from the output of the signal derived from the buffer stage 24.

Conversely, if the signal supplied to the line 78 is chosen such that the transistors 54 and 72 are far more conductive than the transistors 56 and 70, then the inverted form of the signal from the emitter of transistor 30 will be shunted to the circuit ground and the noninverted form will appear on the output line 82.

In the former case the result is a boosting characteristic to the equalization circuit whereas in the latter case it produces a rolling off characteristic. In both cases, the control voltage does not change the direct current operating point of the output current in any way and therefore it does not appear as part of the output signal.

It should be noted that the circuitry, generally designated by the reference numeral 96 which is connected to the output signal line 82, acts as a buffer in supplying the equalized radio frequency signal output to the remaining circuitry of the video tape recorder/reproducer (not shown).

All of the transistors described above are provided with suitable biasing by means of various resistors and power supplies in a well known manner as illustrated in the figure. Since this biasing is conventional it will not be described in greater detail.

Referring now more particularly to FIGS. 2A and 2B a modification of the embodiment depicted in FIG. 1 is illustrated. In this embodiment the same elements, serving the same functions, and connected in basically the same way, have been given the same reference numerals used in describing the embodiment of FIG. 1 but increased by 100. Thus the buffer transistor 24 in FIG. 1 appears as transistor 124 in FIG. 2A, for example. Only the differences between the embodiments of FIGS. 2A and 2B will now be described. In all other respects the embodiment of FIGS. 2A and 2B operates and is constructed in the same manner as the embodiment of FIG. 1.

In the time delay line 110 depicted in FIG. 2A, additional time delay elements 121, 123 and 125 have been connected in series between the time delay element 120 and the base terminal of transistor 124. Also a tap 127 is made in the delay line between element 118 and 120 and a tap 129 is made between the delay elements 120 and 121. Still another tap 131 is made in the delay line between the time delay elements 116 and 118. The tap 131 is connected to a fourth terminal for the rotary switch 128. Taps 127 and 129 are connected to separate terminals of a rotary switch 133 whose pole terminal is connected to the base of an NPN transistor 135 connected in a common emitter configuration.

Thus the output signals derived at the emitters of transistors 124, 130 and 135 constitute, respectively, first, second and third input signals to the control circuit depicted in FIG. 2B.

Referring now more particularly to FIG. 2B, as in the embodiment in FIG. 1 the first signal, appearing at the output of buffer stage 124, is supplied to the base terminals of transistors 138 and 142. The second signal, appearing at the emitter of the transistor 130, is applied to the base terminal of the transistor 152. The third signal, appearing at the emitter of transistor 135, is supplied through the capacitor 188 connected in series with the resistor 186 to the base terminal of the transistor 168. It will be recalled that in the embodiment of FIG. 1 the base terminal of the corresponding transistor 68 was connected through the same combination of a resistor and a capacitor to the circuit ground.

Control signal input line 178 is connected through a resistance 179 to a Hall cell controlled switch assembly 181. Switch assembly 181 alternately supplies a control signal of one predetermined polarity and/or magnitude or another control signal of a different polarity and/or magnitude from an external source in correspondence with the position of the rotary magnetic recording heads whose angular position is sensed by the Hall cell switch assembly 181. Thus as each recording/playback head is rotated into position to record or reproduce signals from the magnetic tape media, a different control signal, which is approprate for that particular recording/playback head, will be supplied to the RF equalization circuit.

In operation, the equalizer control circuit works in fundamentally the same manner as the circuit described in reference to FIG. 1. The only change is that now a signal derived at the taps 127 or 129 in the time delay line 110 is provided through the transistor amplifier 135 to the third signal input terminal at the base of the transistor 168. This third signal will appear at the collectors of the transistors 170 and 172 in inverted form and at the collectors of the transistors 154 and 156 in noninverted form. Again, by the proper choice of the magnitude and polarity of the control signal appearing on line 178, this third signal can be combined with the first and second signals in any desired manner without the control signal appearing in the output derived at line 182.

It should be noted in passing that the switches 128 and 133 are for the purpose of selecting the amount of time delay to be used in the equalization circuit.

Referring now more particularly to FIG. 3 the control circuit is used as a switch for the recording heads. The same elements which operate in the same manner as those depicted in FIG. 1 have been given the same reference numerals increased by 200. In this embodiment the base inputs of the transistors 252 and 268 are connected through the resistances 260 and 286 to one side of the capacitor 288 whose other side is connected to the circuit ground. Also, instead of having the emitters of the transistors 252 and 268 connected together through a resistance and capacitance series connection, as in the embodiments of FIGS. 1 and 2B, in the embodiment of FIG. 3 the emitter of transistor 252 is connected through a resistance 204 to one side of a parallel connected resistors capacitor circuit 203. The other side of the circuit 203 is connected through a capacitor 202 to the emitter of an NPN transistor 201. The base input to the transistor 201 is derived from a terminal 200 of a record/playback head (not shown).

Similarly the emitter of transistor 268 is connected through a resistance 209 to one side of a parallel connected resistor-capacitor circuit 208. The other side of the circuit 208 is connected through a capacitance 207 to the emitter of an NPN transistor 206. The base input to the transistor 206 is derived from a terminal 205 connected to a recording/playback head (not shown). The terminals 200 and 205 are understood to be connected to different recording/playback heads.

Another change from the circuits depicted in the FIGS. 1 and 2B is that in the embodiment of FIG. 3 the base terminals of the transistors 238 and 242 are connected to the circuit ground. Thus the bases of the transistors 238 and 242 are connected through resistors 236 and 240 to one side of a capacitor 234 whose other side is connected to the circuit ground. The control signal line 278 is connected to the output of a differential amplifier 300, one of whose inputs is a head switch terminal 302. The terminal 302 is connected to a head position sensor (not shown) similar to the Hall device switch 181 depicted in FIG. 2B which supplies a signal representative of the angular orientation of the record/playback heads. In this way the control signal supplied at the output of the amplifier 300 is passed through the line 278 to the basic control circuit so that the output of the record/playback heads supplied to the terminals 200 and 205 can be selected by means of a control signal without at the same time introducing the control signal into the output signal derived from the record/playback heads.

While in the above described embodiments the various transistors have been referred to as individual elements, in the preferred embodiment the transistors 38 and 42, and their counterparts in the other embodiments, are a dual transistor and the transistors 52, 54, 56, 68, 70 and 72 and their counterparts in the other embodiments comprise an integrated circuit having a common substrate. This helps make the circuit more thermally stable, among other advantages, such as a lower manufacturing cost.

While there have been described above various arrangements of a control circuit in accordance with the invention for the purpose of illustrating the manner in which the invention may be used to advantage, it will be appreciated that the invention is not limited thereto. Accordingly, any modification, variation or equivalent arrangement within the scope of the accompanying claims should be considered to be within the scope of the invention.

What is claimed is:

1. A circuit for selectively combining two or more input signals to produce a combined output signal in response to a control signal without introducing the control signal into the output signal, the circuit comprising
   a first and a second amplifier circuit, each circuit having corresponding separate pairs of input stages and separate pairs of parallel connected, selectively gain controllable output stages driven by the input stages,
   a combined output terminal,
   a circuit ground,
   means for connecting corresponding ones of the output stages of the first and second amplifier circuits to supply their outputs to the circuit ground and for connecting the other output stages of each amplifier circuit to supply their outputs to the combined output terminal,
   means responsive to the control signal for controlling the gains of opposite ones of the output stages of the first and second amplifier circuits, the other output stages having predetermined, fixed, gains,
   means for supplying a first input signal to one of the input stages of both the first and second amplifier circuits, and
   means for supplying a second input signal in inverted form to the other input stage of the first amplifier circuit and in non-inverted form to the other input stage of the second amplifier circuit.

2. A signal combining circuit as recited in claim 1 further comprising means for supplying a third input signal in non-inverted form to the other input stage of the first amplifier circuit and in inverted form to the other input stage of the second amplifier circuit.

3. A signal combining circuit as recited in claim 1 or 2 wherein the first and second input signals comprise radio frequency signals derived from an external source.

4. A signal combining circuit as recited in claim 1 or 2 further comprising time delay means including an input terminal, an output terminal, a plurality of time delay elements connected in series between the time delay means input and output terminals, at least one signal tap in the series connection of the time delay elements, and wherein the separate means for supplying the first and second input signals to the first and second amplifier circuits derive those signals from the time delay means' output terminal and tap.

5. A signal combining circuit as recited in claim 4 wherein the time delay means comprises first and second time delay elements connected in series between the time delay means' input and output terminals and wherein the tap is located between the time delay means' input terminal and the first time delay element.

6. A signal combining circuit as recited in claim 5 further including a second tap in the time delay means between the first and second time delay elements and wherein the means for supplying the third input signal derives said signal from the second tap.

7. A circuit for combining a plurality of signals in response to a control signal, the combining circuit comprising first, second and third input terminals, a control signal input terminal, an output terminal, first, second, third, fourth, fifth, sixth, seventh and eighth transistors, each having its own base, collector and emitter terminal, means for connecting the collectors of the first and fifth transistors to the output terminal, means for connecting the collector terminals of the second and sixth transistors to the circuit ground, means for connecting the base terminals of the second and fifth transistors to the circuit ground, means for connecting the base terminals of the first and sixth transistors to the control signal input terminal, means for connecting the emitters of the first and second transistors to the collector of the third transistor, means for connecting the emitters of the sixth and fifth transistors to the collector of the seventh transistor, means for connecting the emitter of the third transistor to the collector of the fourth transistor, means for connecting the emitter of the seventh transistor to the collector of the eighth transistor, means for connecting the emitters of the fourth and eighth transistors to the circuit ground, means for connecting a load resistance between the collectors of the fourth and eighth transistors, means for connecting the bases of the fourth and eighth transistors to the first signal input terminal, means for connecting the base terminal of the third transistor to the second signal input terminal, means for connecting the base terminal of the seventh transistor to the third signal input terminal, and biasing means for supplying biasing voltages to the emitter, base and collector electrodes of the first, second, third, fourth, fifth, sixth, seventh and eighth transistors, whereby a signal may be derived at the output terminal which is representative of a signal supplied to the first input terminal plus or minus, depending upon the magnitude and polarity of the signal applied to the control signal input terminal, the difference between the signals supplied to the second input terminal and the signal supplied to the third signal input terminal.

8. The control circuit, as recited in claim 7, further comprising a time delay line having an input terminal, an output terminal, at least a first and a second time delay element connected in series between the input terminal and the output terminal, means for connecting a point in the delay line, which point is located between the input terminal of the time delay line and the first time delay element, to the second signal input terminal of the control circuit, and means for connecting the output terminal of the time delay line to the first signal input terminal of the control circuit.

9. A control circuit as recited in claim 2 further comprising means for connecting the third signal input terminal of the control circuit to a point in the time delay line which is intermediate the first and second time delay elements.

10. A control circuit, as recited in claim 7 or 8, further comprising magnetic media recording means having a plurality of rotatable recording heads, means for sensing the rotation of the recording heads and for producing an output control signal representative of the angular position of the recording heads, a means responsive to said recording head position control signal for supplying a control signal to the control input of the control circuit which is representative of the angular position of the recording heads.

11. A control circuit, as recited in claim 7, wherein the fourth and eighth transistors comprise a dual transistor having a common substrate.

12. A control circuit, as recited in claim 7, wherein the first, second, third, fifth, sixth and seventh transistors comprise an integrated circuit having a common substrate.

* * * * *